(12) United States Patent
Weber et al.

(10) Patent No.: US 7,126,186 B2
(45) Date of Patent: Oct. 24, 2006

(54) COMPENSATION COMPONENT AND PROCESS FOR PRODUCING THE COMPONENT

(75) Inventors: Hans Weber, Ainring (DE); Armin Willmeroth, Augsburg (DE); Uwe Wahl, München (DE); Markus Schmitt, München (DE)

(73) Assignee: Infineon Technolgies AG, Munich (DE)

( * ) Notice: Subject to any disclaimer, the term of this patent is extended or adjusted under 35 U.S.C. 154(b) by 0 days.

(21) Appl. No.: 10/324,823

(22) Filed: Dec. 20, 2002

(65) Prior Publication Data

US 2003/0151087 A1  Aug. 14, 2003

(51) Int. Cl.
*H10L 21/336* (2006.01)
*H01L 31/062* (2006.01)

(52) U.S. Cl. ............ 257/327; 257/328; 257/329; 257/330; 257/331; 257/339; 257/340; 438/268

(58) Field of Classification Search ........ 257/262–263, 257/328–329, 492–493, 266, 287, 335, 342
See application file for complete search history.

(56) References Cited

U.S. PATENT DOCUMENTS

| | | | | |
|---|---|---|---|---|
| 5,216,275 | A * | 6/1993 | Chen | 257/493 |
| 6,667,514 | B1 * | 12/2003 | Ahlers et al. | 257/336 |
| 6,683,347 | B1 * | 1/2004 | Fujihira | 257/341 |
| 2001/0045567 | A1 * | 11/2001 | Auerbach et al. | 257/138 |
| 2002/0003250 | A1 * | 1/2002 | Werner | 257/302 |
| 2002/0088990 | A1 * | 7/2002 | Iwamoto et al. | 257/136 |
| 2002/0135014 | A1 * | 9/2002 | Ahlers et al. | 257/328 |
| 2002/0167044 | A1 * | 11/2002 | Weber | 257/328 |
| 2003/0057479 | A1 * | 3/2003 | Ahlers et al. | 257/328 |
| 2003/0232477 | A1 * | 12/2003 | Deboy et al. | 438/305 |
| 2004/0061182 | A1 * | 4/2004 | ElHatem | 257/371 |

FOREIGN PATENT DOCUMENTS

| | | | |
|---|---|---|---|
| DE | 19815907 | * | 5/1999 |
| DE | 198 40 032 C1 | | 11/1999 |
| DE | 19840032. | * | 11/1999 |
| EP | 1213768 | * | 6/2002 |

* cited by examiner

*Primary Examiner*—Nathan J. Flynn
*Assistant Examiner*—Ahmed N. Sefer
(74) *Attorney, Agent, or Firm*—Laurence A. Greenberg; Werner H. Stemer; Ralph E. Locher

(57) ABSTRACT

A compensation component and a process for production thereof includes a semiconductor body having first and second electrodes, a drift zone disposed therebetween, and areas of a first conductivity type and a second conductivity type opposite the first conductivity type disposed in the drift zone. Higher doped zones of the first type are inlaid in a weaker doped environment of the second type closer to the first electrode and higher doped zones of the second type are inlaid in a weaker doped environment of the first type closer to the second electrode. The drift zone is complementary so that, in a direction between the electrodes, a more highly doped zone of the first type adjoins a more weakly doped environment of the first type, and a more weakly doped environment of the second type adjoins a more highly doped zone of the second type.

5 Claims, 2 Drawing Sheets

FIG. 2
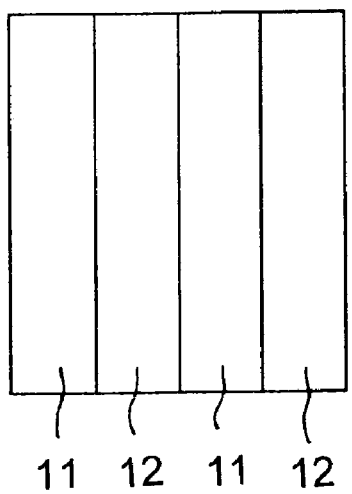
FIG. 3
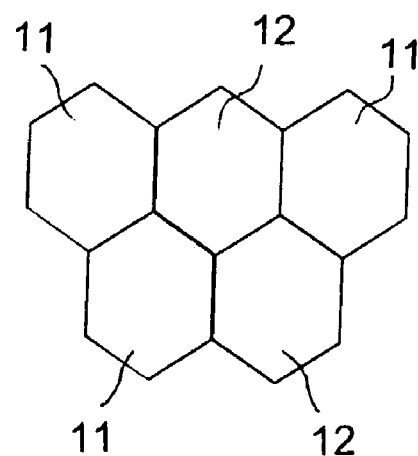
FIG. 4
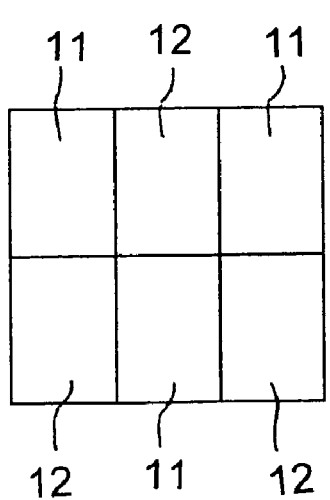
FIG. 5
| 11 | 12 | 11 |
| --- | --- | --- |
| 12 | 11 | 12 |
| 11 | 12 | 11 |

COMPENSATION COMPONENT AND PROCESS FOR PRODUCING THE COMPONENT

BACKGROUND OF THE INVENTION

Field of the Invention

The present invention relates to a compensation component having a semiconductor body with first and second electrodes and a process for producing such a compensation component.

In prior art compensation components, the areas of a first conductivity type (also referred to as conduction type) and the areas of a second conductivity type are so highly doped that there is substantially charge carrier compensation in the region of the drift zone formed by these areas.

A semiconductor component can be a vertical or a lateral semiconductor component. In the case of a vertical semiconductor component, the at least two electrodes, preferably, drain and source of a transistor, lie on two mutually opposite main surfaces of the semiconductor body, while, in a lateral semiconductor component, these electrodes are provided on the same main surface. The first conductivity type is, preferably, the n conductivity type, so that the second conductivity type is the p conductivity type. This means, for example, that p-doped compensation pillars, as they are referred, are inlaid in an, otherwise, n-doped environment in the drift zone. However, the conductivity types can also be reversed. The semiconductor body, itself, preferably is of silicon. However, the body can also be formed from another semiconductor material, such as SiC or $A_{III}B_V$.

An important objective in developing new power semiconductor components is to equip these with high reverse voltage resistances with the lowest possible forward losses. Power semiconductor components, when they are operated in the blocking state, should, therefore, withstand high voltages and, when operated in the forward state, should cause only small forward losses and, therefore, have a low static resistance.

In compensation components as described, for example, in U.S. Pat. No. 4,754,310 to Coe, U.S. Pat. No. 5,216,275 to Chen, and German Patent DE 198 40 032 C1, such an objective is largely achieved by the charge carrier compensation principle: the voltage-accepting drift zone is a configuration of mutually oppositely doped areas. In these areas, the doping levels are set such that, taking into account their geometric dimensions, the space charges of the opposite doping levels in the regions formed by the respective areas of different doping levels compensate each other in the horizontal direction, for example, if, in a vertical component, source and drain are disposed on mutually opposite main surfaces of the semiconductor body. This makes it possible to apply a high electric field over the entire drift zone.

In compensation components, doping concentrations of acceptors and donors in the drift zone are, therefore, possible that lie far above the doping concentrations of corresponding semiconductor components using conventional technology without compensation regions.

In the drift zone, however, as a result of the compensation regions, an electrical conductivity that is improved considerably as compared with conventional semiconductor components is achieved so that, in forward operation, static losses are reduced considerably and low static turn-on resistances can be achieved. In the event of the compensation component being operated in the blocking state, a characteristic course of the electric field is established in the drift zone as a function of the concrete doping level relationships in the compensation regions, the course being essential for the resulting reverse voltage resistance of the compensation component. In an actual construction of a compensation component, in particular, under avalanche conditions, the problems set forth in the following text arise.

If the compensation component is operated without a freewheeling diode in series with an inductive load and is, then, switched off, then the voltage rises above the breakdown voltage, normally measured at about 10 $\mu A/mm^2$. The charge carriers produced by the avalanche effect need a few fractions of nanoseconds to cross the drift zone. Because the space charge in the drift zone is modified by these additionally flowing charge carriers, in order to carry the load current, the voltage rises above the actual value needed statically for such a current. Therefore, due to the avalanche effect, massively intensified generation of electrons and holes occurs. Only when these charge carriers leave the drift zone does the voltage on the compensation component fall. As a result, fewer charge carriers are produced. Because the current is imposed by the external inductive load, part of the current, therefore, flows as a displacement current, and the voltage rises again. The voltage oscillates with high frequency in the region of GHz, which is generally designated by the term Trapped Plasma Avalanche Triggered Transit (TRAPATT) oscillation.

Such TRAPATT oscillations occur above a current density that is typical for the component and can lead to local damage or even destruction of the compensation component. In addition, with regard to EMC regulations for specific applications of the component, it can be critical or even impermissible. In other words, TRAPATT oscillations restrict the field of application of compensation components severely and, not least, reduce their reliability as a result of the risk of destruction.

For the following more detailed explanations relating to TRAPATT oscillations, a vertical compensation component is to be assumed, in which the drift zone is of an n-doped environment in which p-doped compensation pillars are inlaid. The n-doping is, in such a case, produced by deposition of an n-doped epitaxial layer, into which the p-doped compensation pillars are introduced by masked implantation.

In such a compensation component, the area of maximum field strength lies approximately at the center of the component, that is to say, approximately in the center between source and drain and, in such a case, in the vicinity of the pn junction between the p-doped compensation pillars and the n-doped environment of the drift zone. In this area of the maximum field strength, charge carriers, that is to say, electrons and holes, are generated in the event of an avalanche. The electrons are moved by the electric field in the direction of the drain and in the direction of the n-doped part of the drift zone, that is to say, horizontally, if the direction between drain and source is referred to as vertical. The movement in the direction of the n-doped part of the drift zone is, in such a case, carried out due to the transverse electric field that is present between the p-doped compensation pillars and the n-doped environment of the drift zone.

In the drift zone, the electric field is substantially more homogeneous or less wavy in the n-doped environment than in the p-doped compensation pillars. The cause for such a characteristic lies in the substantially more homogeneous doping of the n-doped environment as compared with the p-doped compensation pillars. This is because, in the p-doped compensation pillars, the doping varies considerably in the vertical direction so that the electric field runs in a wavy form there, while there is substantially constant doping in the n-doped environment.

These differences in the course of the doping, then, have the effect that the electrons predominantly move in areas without pronounced field maxima, while the holes, which are urged by the transverse field into the center of the p-doped compensation pillars, pass through areas with locally very high field strengths. Because considerably more intensive multiplication of the charge carriers then occurs in areas of high field strengths, on their way through the p-doped compensation pillars to the source, the holes produce a large quantity of secondary charge carriers. It has been shown that, in such a case, more charge carriers are generated in the vicinity of the source than primarily in the area of the maximum electric field.

In the quasi-steady state, exactly one field strength distribution belongs to a specific avalanche current. In the real compensation component, when the avalanche event occurs, in principle, a deviation from the quasi-steady state field distribution is produced because of the finite extent of the compensation component and because of inhomogeneities. If, for example, the field strength exceeds its quasi-steady-state value because of a transient process, then, in the area of the highest field strength, more charge carriers will be generated than correspond to the quasi-steady state. On their way to the source or drain, these excess charge carriers produce further charge carriers. If the charge carriers arrive at the edges of the space charge zone, which lasts for a few 100 ps because of the saturation speed of the charge carriers, they lead to a reduction in the voltage and of the electric field below the quasi-steady-state value. Consequently, too few charge carriers are generated as a result. The load current then flows as displacement current, and the electric field rises again to values above the quasi-steady-state equilibrium. Depending on the number of secondary charge carriers produced, such a process swings into an oscillation, namely the TRAPATT oscillation.

Simulations show that, in compensation components with high secondary generation of charge carriers, the amplitude of the TRAPATT oscillation tends to increase, while in compensation components with low generation of secondary charge carriers, on the other hand, the amplitude of the oscillation tends to decrease so that no TRAPATT phenomena occur.

One possible way of improving the avalanche behavior is described in German Patent DE 198 40 032 C1 mentioned above. This document discloses that the course of the doping concentration in a vertical compensation component is configured variably in the vertical direction between source and drain so that the maximum electric field strength is reached approximately at the center of the compensation component, between source and drain, and falls in the direction of the main surfaces of the semiconductor body, that is in the direction of source and drain.

Another possible way of improving the avalanche behavior is specified in the earlier application German Published, Non-Prosecuted Patent Application DE 101 20 656.9 (2000 E 18358 DE), in which the course of the electric field is chosen such that it has a peak in the center of the compensation component and is considerably higher than in the remaining volume of the semiconductor body. Therefore, in areas of the drift zone where no generation of primary charge carriers occurs, the electric field is reduced considerably so that the production of secondary charge carriers is also correspondingly reduced.

A third possible way of improving the avalanche behavior lies in reducing the tendency to TRAPATT oscillations by the location of the maximum electric field strength being shifted from the center of the p-conductive compensation pillars into their marginal area. As a result, the path of the charge carriers generated in the event of an avalanche tends to be displaced into areas with lower field strengths.

German Patent DE 198 40 032 C1 describes a semiconductor component in which, in the drift zone, the charge of a first, p-doped region is variable, while the charge of second, n-doped regions is in each case kept constant, or the charge of the first regions is constant while the charge of the second regions is varied. In such a case, the charge can also be configured variably in the first and second regions. In addition, there can be a zone in which there is a "neutral" charge.

SUMMARY OF THE INVENTION

It is accordingly an object of the invention to provide a compensation component that overcomes the hereinafore-mentioned disadvantages of the heretofore-known devices and methods of this general type and in which the avalanche behavior is further improved; in addition, a process for producing such a compensation component is to be specified.

With the foregoing and other objects in view, there is provided, in accordance with the invention, a compensation component, including a semiconductor body having a first electrode, a second electrode, a drift zone disposed between the first and second electrodes, areas of a first conductivity type and areas of a second conductivity type opposite the first conductivity type being disposed at least in the drift zone, more highly doped zones of the first conductivity type being inlaid in a more weakly doped environment of the second conductivity type in a first region of the drift zone closer to the first electrode than to the second electrode, more highly doped zones of the second conductivity type being inlaid in a more weakly doped environment of the first conductivity type in a second region of the drift zone closer to the second electrode than to the first electrode, and the drift zone being complementary so that, in a direction between the first and second electrodes, a more highly doped zone of the first conductivity type adjoins a more weakly doped environment of the first conductivity type, and a more weakly doped environment of the second conductivity type adjoins a more highly doped zone of the second conductivity type.

The compensation component is of complementary construction: in the case of a vertical structure, therefore, lower layers, for example, contain p-doped zones in an otherwise n-doped environment, while upper layers have n-doped zones in a p-doped environment. The n-doped environment of the lower layers can be produced, for example, by epitaxial deposition of an n-doped layer, in which the p-doped zones are, then, formed by masked boron implantation with subsequent outward diffusion. The upper layers are formed by epitaxy of a p-doped layer, in which the n-doped zones are produced by phosphorus implantation. The upper and lower layers are in such a case disposed such that normal coherent p-doped pillars are formed in a coherent n-doped drift path.

In the case of a compensation component, the greatest fluctuations or waviness in the electric field occur in the regions in which the doping concentration varies vertically. In the above example, these are the n-doped zones in the upper area placed closer to the source and the p-doped zones in the lower area placed closer to the drain.

The transverse field in the compensation component according to the invention runs in the same way as in existing compensation components: holes are urged into the p-doped zones and into the p-doped compensation pillars, while electrons are extracted toward the n-doped zones.

Because the doping concentrations are, preferably, chosen such that the maximum electric field strength is present at the boundary between the p-doped zones in the n-doped environment and, respectively, between the n-doped zones in the p-doped environment, both types of charge carrier, namely the electrons and the holes, are urged away into regions with lower electric field strength so that the production of secondary charge carriers is largely suppressed.

In accordance with another feature of the invention, the first and second regions and their respective environments form compensation regions disposed to produce coherent compensation pillars of the second conductivity type in the drift zone otherwise doped with a dopant of the first conductivity type.

In accordance with a further feature of the invention, the compensation regions are disposed in one of the group selected from a strip, a hexagonal grid, a rectangular grid, and a square grid.

In accordance with an added feature of the invention, the compensation regions are doped so highly that a maximum electric field strength occurs at a boundary between the first region and the second region.

In accordance with an additional feature of the invention, the first conductivity type is an n-conductivity type.

In accordance with yet another feature of the invention, the semiconductor body has a vertical structure.

In accordance with yet a further feature of the invention, the semiconductor body is a MOS transistor.

With the objects of the invention in view, there is also provided a compensation component, including a semiconductor body having a first electrode, a second electrode, a drift zone disposed between the first and second electrodes, areas of a first conductivity type and areas of a second conductivity type opposite the first conductivity type being disposed at least in the drift zone, and the drift zone being complementary so that in a first region closer to the first electrode than to the second electrode, more highly doped zones of the first conductivity type are inlaid in a more weakly doped environment of the second conductivity type and, in a second region closer to the second electrode than to the first electrode, more highly doped zones of the second conductivity type are inlaid in a more weakly doped environment of the first conductivity type.

With the objects of the invention in view, there is also provided a process for producing a compensation component, including the steps of providing a semiconductor body with first and second electrodes, a drift zone disposed between the first and second electrodes, and areas of a first conductivity type and areas of a second conductivity type opposite the first conductivity type being disposed at least in the drift zone, inlaying, in a region closer to the first electrode than to the second electrode, more highly doped zones of the first conductivity type in a more weakly doped environment of the second conductivity type, inlaying, in a region closer to the second electrode than to the first electrode, more highly doped zones of the second conductivity type in a more weakly doped environment of the first conductivity type, and constructing the drift zone to be complementary and form compensation regions of the first and second conductivity types by one of simple epitaxy and multiple epitaxy of the second conductivity type with respectively subsequent implantation of dopant of the first conductivity type, such that, in a direction between the first and second electrodes, a more highly doped zone of the first conductivity type adjoins a more weakly doped environment of the first conductivity type, and a more weakly doped environment of the second conductivity type adjoins a more highly doped zone of the second conductivity type.

Other features that are considered as characteristic for the invention are set forth in the appended claims.

Although the invention is illustrated and described herein as embodied in a compensation component, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 2 is a diagrammatic illustration of compensation regions according to the invention disposed in strips;

FIG. 3 is a diagrammatic illustration of compensation regions according to the invention disposed in a hexagonal grid;

FIG. 4 is a diagrammatic illustration of compensation regions according to the invention disposed in a rectangular grid; and FIG. 5 is a diagrammatic illustration of compensation regions according to the invention disposed in a square grid.

DESCRIPTION OF THE PREFERRED EMBODIMENTS

Figure 1:
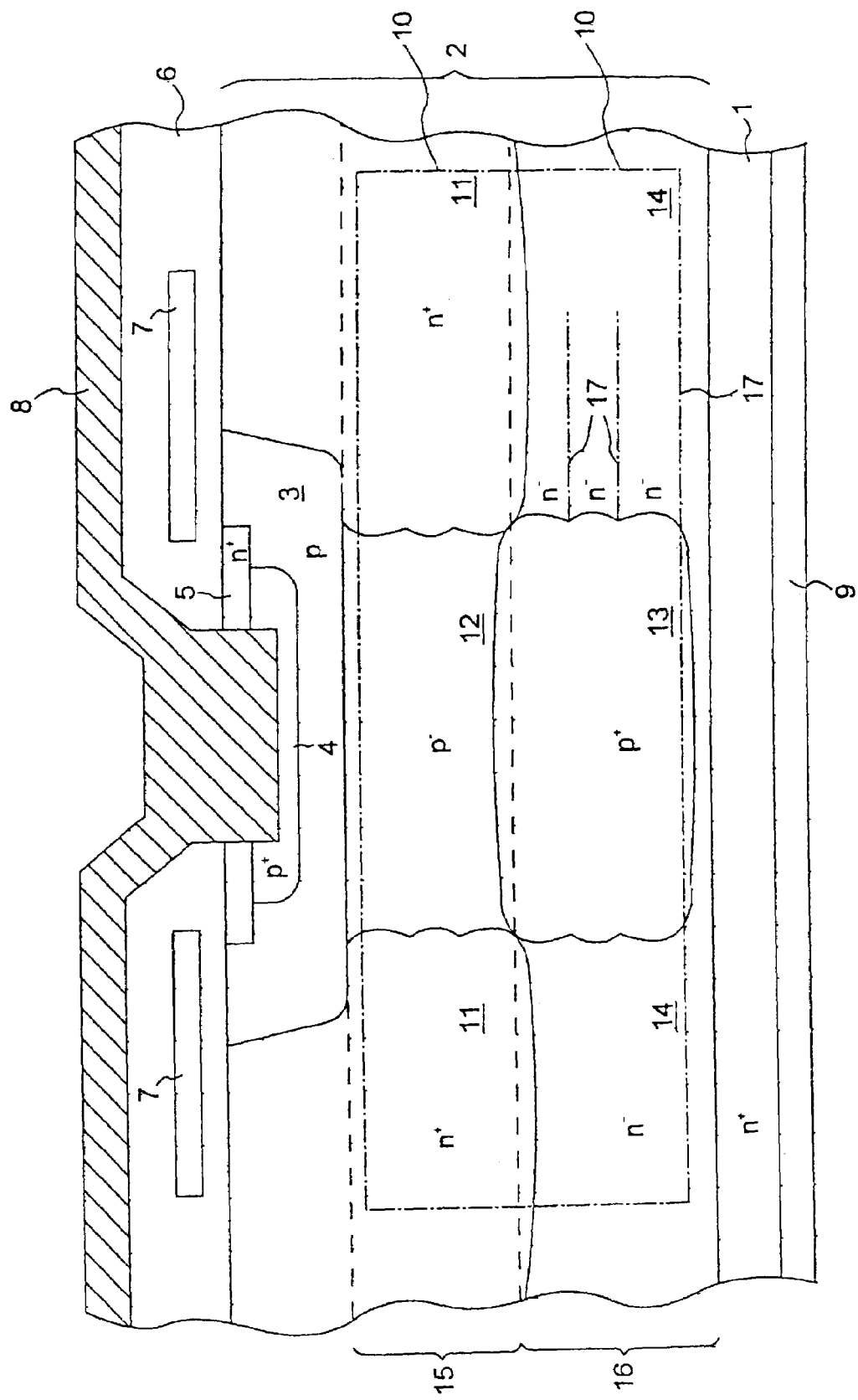
FIG. 1 is a cross-sectional view through a vertical transistor in an exemplary embodiment of the compensation component according to the invention.

Referring now to the figures of the drawings in detail and first, particularly to FIG. 1 thereof, there is shown a compensation component according to the invention having an $n^+$-doped silicon substrate 1, which is covered by a doped silicon layer 2 produced in one or more steps. In the silicon layer 2 there is a p-doped body zone 3 which, in turn, contains a $p^+$-doped connecting region 4 and, at its surface, an $n^+$-doped source zone 5. In an insulating layer 6 of silicon dioxide, for example, provided on a first main surface of the semiconductor body formed in this way, there is a gate electrode 7 of, preferably, doped polycrystalline silicon. Contact is made with the source zone 5 and the connecting region 4 by a source electrode 8 of aluminum, for example, while, on the other main surface of the semiconductor body, that is to say, on the "rear side" of the silicon substrate 1, a drain electrode 9 is provided.

The MOS transistor so formed contains, as a compensation component, compensation regions 10 in its drift path, which is substantially formed by the silicon layer 2. According to the invention, these compensation regions 10 are of complementary construction, which means that in a region 15 lying closer to the source electrode 8 $n^+$-doped zones 11 are provided in an otherwise $p^-$-doped environment 12, and in a region 16 located closer to the drain electrode 9 $p^+$-doped zones 13 are provided in an $n^-$-doped environment 14.

The production of such a compensation component can be carried out as set forth in the following text.

Following base epitaxy on the n$^+$-doped silicon substrate, to form the n$^-$-doped layer underneath the zones 13, three n$^-$-epitaxial steps (cf. dash-dotted lines 17) are performed, masked boron implantation being carried out after each individual epitaxial step to form the p$^+$-doped zones 13 in this way. Alternatively, it is also possible to perform only n$^-$-epitaxy here, following which, high-energy implantation with boron is, then, carried out to form the zones 13 in the otherwise n$^-$-doped environment.

The n$^+$-doped zones 11 in the otherwise p$^-$-doped environment 12 are produced in an analogous way by one or, likewise, three p$^-$-epitaxial steps with one or more masked implantations of, for example, arsenic.

Instead of three epitaxial steps and subsequent implantations, it is, of course, also possible to perform only two or more epitaxial steps and subsequent implantations, in order in this way to form the n$^+$- and p$^+$-doped zones 11 and 13 by implantation in the p$^-$-environment 12 and n$^-$-doped environment 14 produced by epitaxy. In addition, apart from boron and phosphorus, other suitable p- and n-dopants can be used for the implantations.

In the case of a compensation component with a vertical structure, as shown in FIGS. 2, 3, 4, and 5, the compensation regions 10 can be disposed as strips or in a hexagonal grid or a rectangular grid or a square grid or in another configuration.

The significant feature in the compensation component according to the invention, as has already been mentioned many times, is the complementary configuration of the compensation regions 10. These compensation regions 10 are doped such that, in the upper region 15, n$^+$-doped zones 11 lie in a p$^-$-doped environment 12 and, in the lower region 16, p$^+$-doped zones 13 lie in an n$^-$-doped environment 14, and the maximum electric field lies at the boundary between the regions 15 and 16 and, there, preferably at the boundary between the regions 12 and 14. As a result, the charge carriers of both conductivity types are in each case urged away into a region of lower field strength, which largely suppresses the production of secondary charge carriers. As a result of the suppression of the production of secondary charge carriers, the avalanche behavior is considerably improved because TRAPATT oscillations are virtually no longer produced.

We claim:

1. A compensation component, comprising:
   a semiconductor body having:
      a first electrode;
      a second electrode;
      a drift zone disposed between said first and second electrodes, said drift zone including a first region closer to said first electrode than to said second electrode and a second region closer to said second electrode than to said first electrode, said first region directly adjoining said second region;
      more highly doped zones of a first conductivity type being inlaid in a more weakly doped environment of a second conductivity type only in said first region of said drift zone;
      more highly doped zones of said second conductivity type being inlaid in a more weakly doped environment of said first conductivity type only in said second region of said drift zone; and
      said drift zone being complementary so that, in a direction between said first and second electrodes, a more highly doped zone of said first conductivity type adjoins a more weakly doped environment of said first conductivity type, and a more weakly doped environment of said second conductivity type adjoins a more highly doped zone of said second conductivity type;
      said more highly doped zone of said second conductivity type and said more weakly doped environment of said second conductivity type forming compensation regions disposed to produce coherent compensation pillars of said second conductivity type in said drift zone otherwise doped with a dopant of said first conductivity type;
      said compensation regions being doped to such an extent that a maximum electric field strength occurs at a boundary between said first region and said second region and the space charges thereof compensate each other.

2. The compensation component according to claim 1, wherein said compensation regions are disposed in one of the group selected from a strip, a hexagonal grid, a rectangular grid, and a square grid.

3. The compensation component according to claim 1, wherein said first conductivity type is an n-conductivity type.

4. The compensation component according to claim 1, wherein said semiconductor body has a vertical structure.

5. The compensation component according to claim 1, wherein said semiconductor body is a MOS transistor.

* * * * *